(12) United States Patent
Butler et al.

(10) Patent No.: US 7,538,273 B2
(45) Date of Patent: May 26, 2009

(54) CABLE CONNECTION TO DECREASE THE PASSING ON OF VIBRATIONS FROM A FIRST OBJECT TO A SECOND OBJECT

(75) Inventors: Hans Butler, Best (NL); Martinus Van Duijnhoven, Deurne (NL); Johan Hendrik Geerke, Eindhoven (NL); Joost De Pee, Veldhoven (NL); Cornelius Adrianus Lambertus De Hoon, Best (NL)

(73) Assignee: ASML Netherlands B.V., Veldhoven (NL)

( * ) Notice: Subject to any disclaimer, the term of this patent is extended or adjusted under 35 U.S.C. 154(b) by 261 days.

(21) Appl. No.: 11/500,495

(22) Filed: Aug. 8, 2006

(65) Prior Publication Data
US 2008/0035372 A1 Feb. 14, 2008

(51) Int. Cl.
*H02G 15/08* (2006.01)
(52) U.S. Cl. .................................................. 174/84 R
(58) Field of Classification Search ............... 174/74 R, 174/78, 84 R, 36, 106 R, 108, 117 R, 117 F, 174/117 FF
See application file for complete search history.

(56) References Cited

U.S. PATENT DOCUMENTS

| 4,746,766 | A | * | 5/1988 | Soulard | 174/36 |
| 4,898,351 | A | * | 2/1990 | Suzuki | 248/51 |
| 5,016,841 | A | * | 5/1991 | Schumann et al. | 248/51 |
| 2003/0168244 | A1 | * | 9/2003 | Nagai et al. | 174/117 F |
| 2005/0128460 | A1 | * | 6/2005 | Van Den Biggelaar et al. | 355/72 |
| 2006/0187428 | A1 | * | 8/2006 | Bleeker et al. | 355/53 |

* cited by examiner

*Primary Examiner*—William H Mayo, III
(74) *Attorney, Agent, or Firm*—Sterne, Kessler, Goldstein & Fox P.L.L.C.

(57) ABSTRACT

A cable connection between a first object and a second object includes a cable bundle of one or more cables having a certain length. One end of the cable bundle is fixed to the first object and another end of the bundle is fixed to the second object. A cable bundle holder configured to hold the cable bundle at a certain location along the length of the cable bundle, and a control system configured to control the position of the cable bundle holder with respect to the second object are presented. A control system for cable connection, and a method of reducing the transfer of vibrations from a first object to a second object via a cable connection are also presented.

10 Claims, 4 Drawing Sheets

CABLE CONNECTION TO DECREASE THE PASSING ON OF VIBRATIONS FROM A FIRST OBJECT TO A SECOND OBJECT

FIELD

The present invention relates to a cable connection, a control system for a cable connection, and a method of reducing the passing on or transfer of vibrations from a first object to a second object via a cable connection.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A conventional lithographic apparatus includes a base frame which is supported on the ground and a vibration isolated frame often referred to as metro-frame. The metro-frame is substantially isolated from external influences, such as vibrations in the base frame, by the use of vibration isolating mounts, such as air mounts, which support the metro-frame on the base frame. These isolated mounts may be actively controlled to isolate vibrations which are introduced by the base frame and/or by the isolated frame itself. These latter vibrations may for instance be caused by movement of stages or other moving parts arranged on the metro-frame. On the metro-frame the projection system is mounted. As the metro-frame is substantially isolated from vibrations with the vibration isolating mounts, the accuracy of projection is substantially increased.

In conventional lithographic apparatus, a cable connection is provided between the base frame and the metro-frame. Such cable connection has a cable bundle which runs from the base frame to the metro-frame. The cable bundle includes a number of cables which are typically used to provide a connection for electricity, compressed air, or compressed fluid between the base frame and the metro-frame. The electrical connection may for instance be used to energize a certain part on the metro-frame or the electrical connection may be used to transfer a measurement or control signal, for instance between a sensor or actuator arranged on the metro-frame and a central control unit which is mounted on the baseframe.

To avoid that the cable bundle passes on or transfer vibrations from the base frame to the metro-frame, the cable bundle is arranged in a wave-shape or twist so that these vibrations are absorbed to a certain extent by the flexibility of the cable bundle.

However, since in general more and more cables have to be guided from the base-frame to the metro-frame, the flexibility of the cable bundle decreases, and as a consequence vibrations are passed on or transferred more easily. On the other hand, requirements on the vibration isolation in the metro-frame are constantly increasing due to general requirements with respect to overlay and throughput performance of the lithographic apparatus.

In a lithographic apparatus, the stiffness of the wave-shaped cable bundle may come in the same range as the stiffness of the vibration isolating air-mounts which support the metro-frame on the base frame. As a consequence, base frame vibrations may excite the metro-frame, creating larger noise levels in the metro-frame, which results in larger lens vibrations. It will be clear that this is undesirable as it has a direct influence on the accuracy of the projection process, and thus overlay performance of the lithographic apparatus

SUMMARY

It is desirable to provide a cable connection between a first object and second object in which the passing on or transfer of vibrations from the first object to the second object is reduced.

According to an embodiment of the invention, there is provided a cable connection between a first object and a second object, including a cable bundle of one or more cables having a certain length, one end of the cable bundle fixed to the first object and another end of the cable bundle fixed to the second object, a cable bundle holder holding the cable bundle at a location along the length of the cable bundle, and a control system configured to control a position of the cable bundle holder with respect to the second object.

According to an embodiment of the invention, there is provided a control system configured to control a position of a cable bundle holder holding a cable bundle between a first object and a second object at a location along the length of the cable bundle with respect to the second object, the control system including a sensor configured to measure a position quantity of the cable bundle holder with respect to the second object, an actuator configured to actuate the cable bundle holder, and a controller unit configured to provide a control signal to the actuator on the basis of a position quantity measured by the sensor.

According to an embodiment of the invention, there is provided a method of decreasing the passing on or transfer of vibrations from a first object to a second object via a cable connection including a cable bundle running from the first object to the second object, the method including providing a cable bundle holder holding the cable bundle at a certain location along the length of the cable bundle, and controlling the position of the cable bundle holder with respect to the second object by measuring a position quantity of the cable bundle holder with respect to the second object, providing a control signal on the basis of a position quantity measured by the sensor, and feeding the control signal to an actuator configured to actuate the cable bundle holder.

According to another embodiment of the invention, there is provided a lithographic apparatus including (a) an illumination system configured to condition a beam of radiation; (b) a pattern support configured to support a patterning device, the patterning device configured to pattern the beam of radiation to form a patterned beam of radiation; (c) a substrate support configured to support a substrate; (d) a projection system configured to project the patterned beam of radiation onto the substrate; and (e) a control system configured to control a position of a cable bundle holder arranged to hold a cable bundle between a first object and a second object at a location along a length of the cable bundle with respect to the second object, the control system including (i) a sensor configured to determine a position of the cable bundle holder with respect to the second object, (ii) an actuator configured to actuate the cable bundle holder, and (iii) a controller configured to control the actuator based on the position determined by the sensor.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
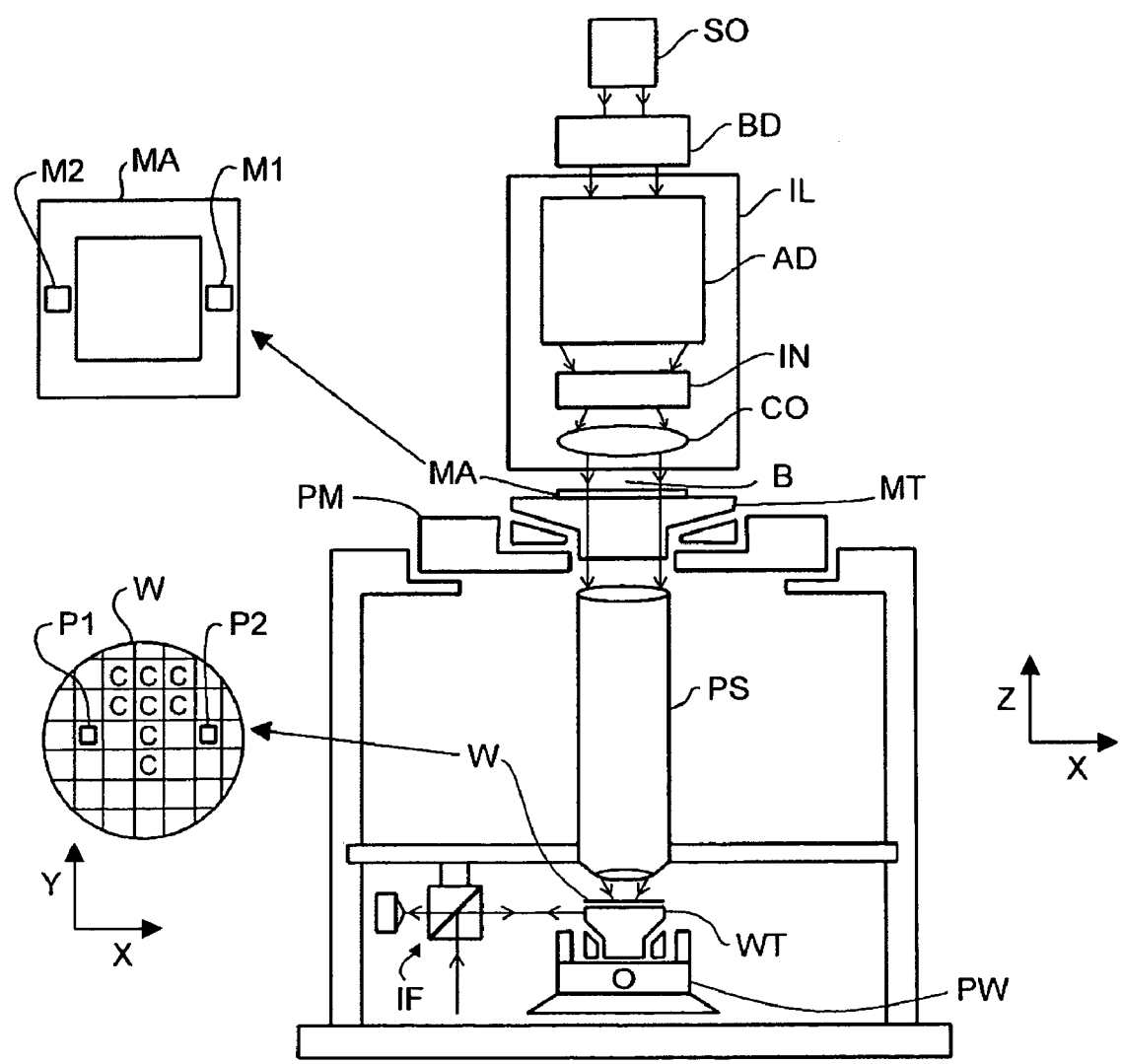
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or other radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The projection system of the lithographic apparatus may be mounted on a so-called metro-frame or vibration isolated frame to reduce influences of the environment on the projection process, such as mechanical vibrations introduced from the ground, for instance a factory floor. The metro-frame is isolated from such influences by supporting the metro frame on vibration isolating mounts. The vibration isolating mounts, which may be actively controlled, are arranged on a base frame which base frame is supported on the factory floor. Thus, vibrations in the factory floor or such that are passed on or transferred to the baseframe, will to a certain extent not be passed on or transferred to the metro frame, as the metro frame is supported on the vibration isolating mounts. However, often a cable connection is provided between the base frame and the metro-frame, which cable connection may also pass on vibrations from the baseframe to the metro-frame.

Figure 2:
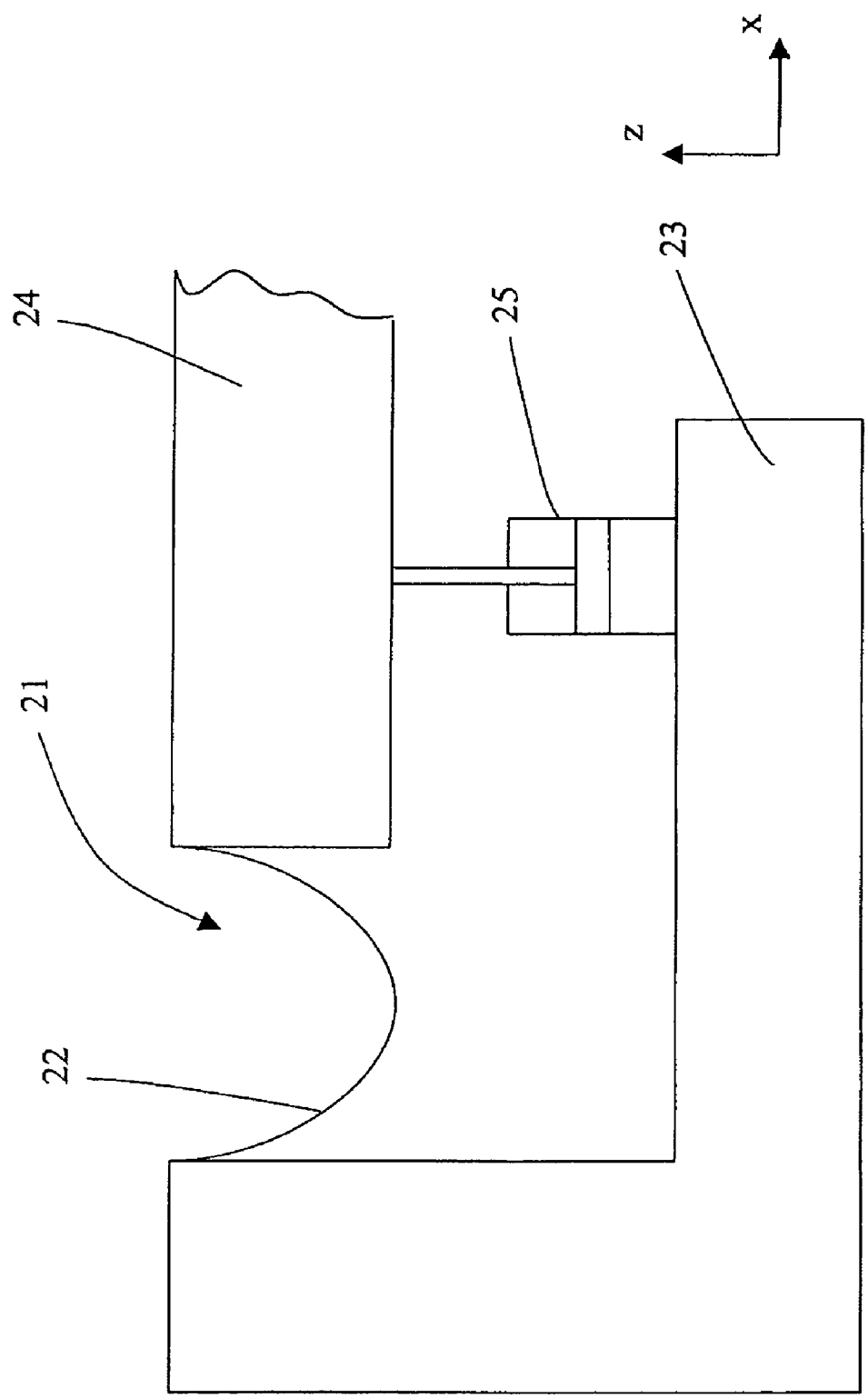
FIG. 2 depicts a schematic side-view of a conventional cable connection.

FIG. 2 shows a side view of a conventional cable connection, which cable connection in general is indicated with the reference numeral 21. The cable connection 21 includes a cable bundle 22 which runs from the base frame 23 to the metro-frame 24. The cable bundle 22 is fixed to both the baseframe 23 and the metro-frame 24, but may run further along the base frame 23 and/or metro-frame 24. The cable bundle 22 includes a number of cables. The cables may for instance be electrical cables which are used to energize certain parts which are directly or indirectly mounted on the metro-frame, or are used to transfer measurement or control signals. Also, the cables may be hoses containing compressed air or fluid. The metro-frame 24 is supported by the base frame 23 with a number of vibration isolating air mounts 25.

To avoid that the cable bundle 22 of the conventional cable connection 21 directly transfers vibrations from the base frame 23 to the metro-frame 24, the cable bundle 22 does not run in a straight line from the base frame 23 to the metro-frame 24, but runs in a wave-shape or twist. Such shape of the cable bundle gives the cable bundle 22 a certain flexibility with which vibrations or movements in the base frame 23 may be isolated from the metro-frame 24.

However, this isolation of vibrations/movements may only be to a certain extent. As the number of cables and/or size of cables has substantially increased in the lithographic apparatus, the flexibility may without further measures decrease, and as a result the vibrations and/or movements of the base frame may less well be isolated by the metro-frame 4. Moreover, as the requirements on the performance of the lithographic apparatus are constantly increasing the extent in which vibrations have to be isolated is also increasing.

Since, due to the increasing amount of cables and the increasing performance of vibration isolating mounts, the stiffness of the cable bundle 22 comes in the range of the stiffness of the vibration isolating mounts 25 supporting the metro-frame 24, the presence of a wave-shape or twist in the cable bundle may not provide sufficient vibration isolation between the base frame 23 and the metro-frame 24.

In an embodiment of the present invention, there is provided a cable connection including a control system with which the passing on or transfer of vibrations and/or movements from base frame 23 to the metro-frame 24 is further reduced.

Figure 3:
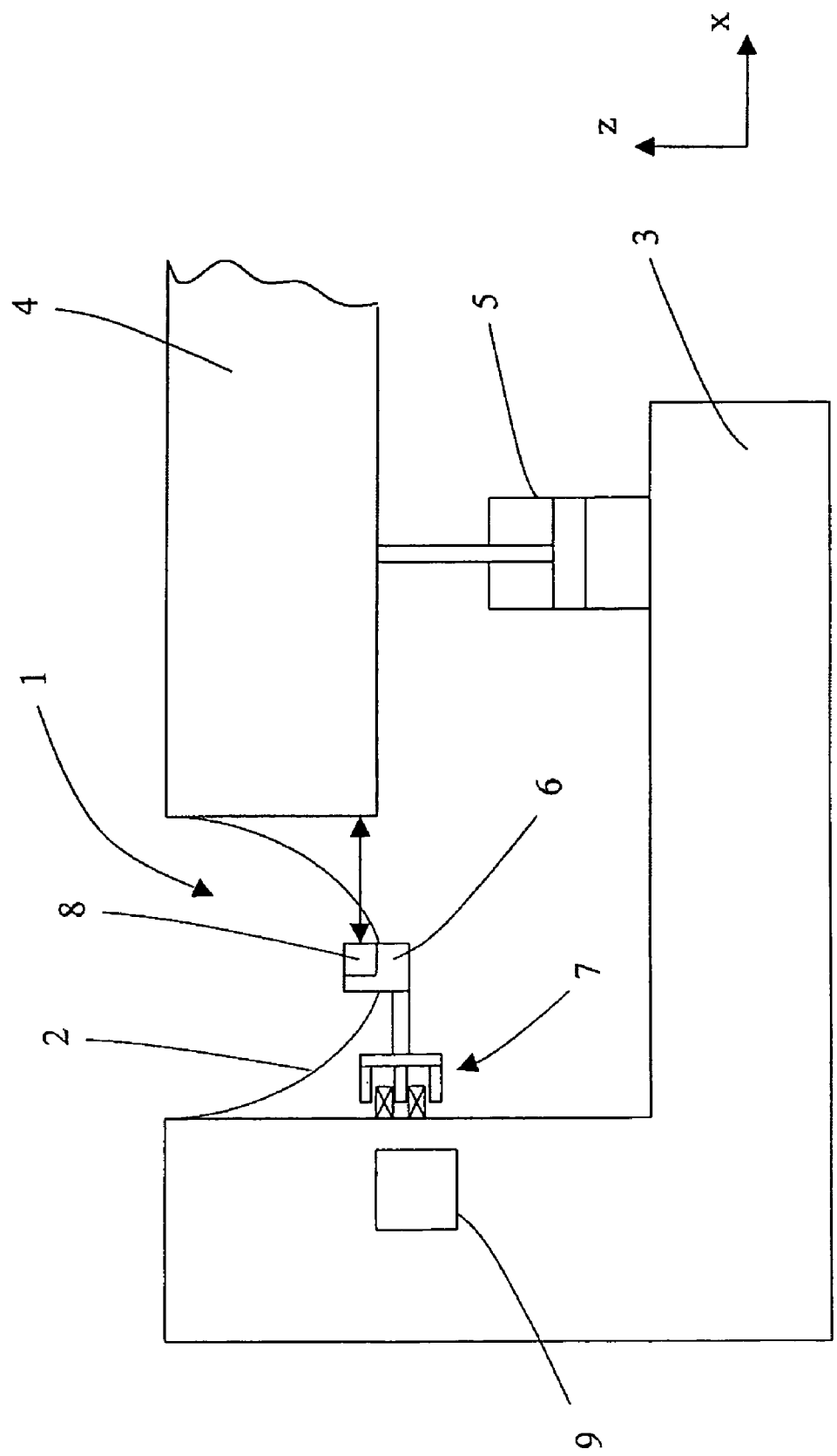
FIG. 3 depicts a schematic side view of an active cable connection according to an embodiment of the invention.

FIG. 3 shows a cable connection according to an embodiment of the invention. The cable connection 1 includes a cable bundle holder 6 which holds the cable at a certain location along the length of the cable bundle. This location may be anywhere along the length of the cable bundle 2 running between the baseframe 3 and the metro-frame 4 but will practically be located at a certain distance from both the base frame 3 and the metro-frame 4. In the embodiment of FIG. 3, the cable bundle holder 6 holds the cable bundle 2 at about halfway the length of the cable bundle 2.

The cable bundle holder 6 can be moved in at least the x-direction by an actuator 7 which is mounted on the base frame 3. Thus, any reaction forces of the actuator 7 resulting from actuating the cable bundle holder 6 in a certain direction, will be exerted on the base frame 3. The actuator 7 is a Lorentz actuator, but may be any suitable type of actuator which may used to move the cable bundle holder 6 in at least the x-direction, such as for instance an electric actuator, a pneumatic or hydraulic actuator. Preferably, the actuator does not have any stiffness, i.e. is not capable of passing or transferring any movements or vibrations of the base-frame 3 to the cable bundle holder 6, such as the Lorentz actuator 7 of FIG. 3.

A sensor 8 is mounted on the cable bundle holder 6. This sensor 8 is configured to measure the position of the cable bundle holder 6 in at least the x-direction with respect to the metro-frame 4. The sensor may be any suitable type of position sensor, such as a capacitive, inductive or encoder-type sensor, or a combination thereof. Furthermore, a controller 9 is arranged on the base frame 3 which can provide a control signal for the actuator 7 based on the position measurement of the sensor 8.

With this control system, i.e. actuator 7, sensor 8, and controller 9, it is possible to control the position of the cable bundle holder 6 with respect to the metro-frame 4. By holding the cable bundle holder 6 in substantially the same position with respect to the metro-frame 4, i.e. the cable bundle holder 6 follows movements of the metro-frame 4 in the x-direction, the shape of the part of the cable bundle 2 which runs between the metro-frame 4 and the cable bundle holder 6 will substantially not change, and as a result there will not be a change in the force which is exerted by this part of the cable bundle 2 on the metro-frame 4. As a result, any forces in the x-direction that are introduced in the cable connection due to movements of the base frame 3, will substantially not be passed on or transferred by the cable connection to the metro-frame 4.

In this respect it is beneficial that the cable bundle 2 be firmly held by the cable bundle holder 6 to avoid that any forces or changes in the shape of the cable bundle between the base frame 3 and the cable bundle holder 6 may result in a change of the shape of the cable bundle 2 between the cable bundle holder 6 and the metro-frame 4.

Furthermore, it is beneficial that the reaction forces of the actuator 7 are exerted on the base frame 3 by mounting the actuator 7 on the base frame 3. As an alternative, the actuator 7 may be mounted on any other part of the lithographic apparatus, but preferably not on the metro-frame 4. In the latter case the reaction forces would be exerted on the metro-frame, and it may be difficult to control the position of the cable bundle holder 6 with respect to the metro-frame 4 in order to avoid that the cable connection passes on or transferred any vibrations from the base frame 3 to the metro-frame 4. The sensor 8 is in the present embodiment mounted on the cable bundle holder 6. In alternative embodiments, the sensor or two or more sensors may be provided at different locations in which it is possible to directly or indirectly measure the position of the cable bundle holder 6 with respect to the metro-frame 4.

The controller 9 may for instance include a feed-forward unit which uses a feed-forward path to actuate the cable bundle holder 6 based on a measurement of the sensor 8. The sensor 8 may measure the position of the cable bundle holder 6 with respect to the metro-frame 4. However, also the speed or acceleration of the cable bundle holder 6 with respect to the metro-frame 4 may be used as a feed-forward signal of the controller unit 9. In such case the sensor 8 may be a speed or acceleration sensor which determines the speed or acceleration of the cable bundle holder 6 with respect to the metro-frame 4.

The controller 9 may also be a feedback controller which is configured to hold the cable bundle holder 6 in substantially the same position with respect to the metro-frame 4. In an embodiment the controller 9 includes both a feed-forward unit and a feed-back controller. Any other controller being capable of holding the cable bundle holder 6 in the substantially same position in one or more degrees of freedom with respect to the metro-frame may also be used.

Figure 4:
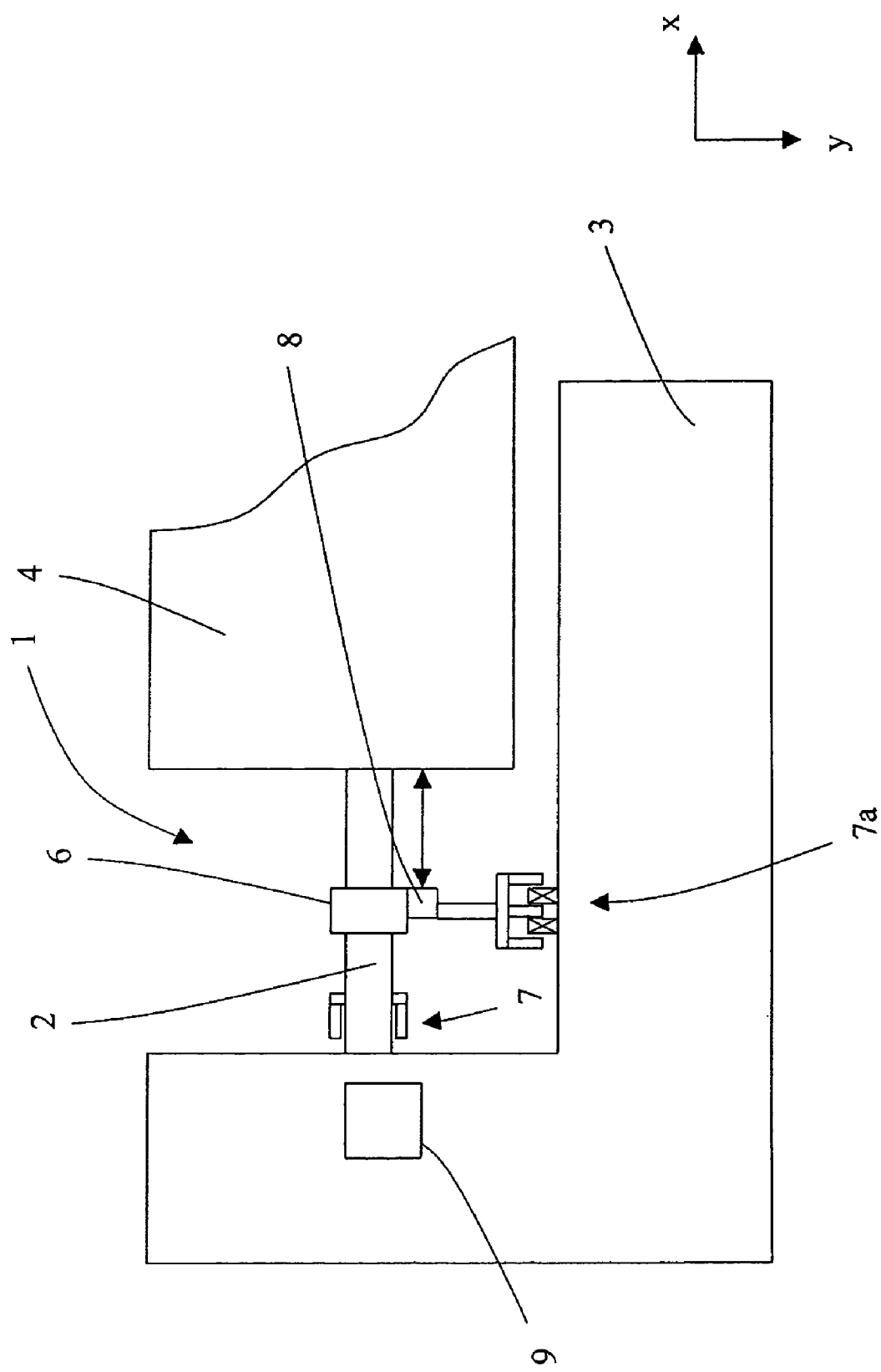
FIG. 4 depicts a schematic top view of an active cable connection according to another embodiment of the invention.

FIG. 4 shows a top view of a cable connection according to an embodiment of the invention. This cable connection includes all parts of the cable connection of FIG. 3. In addition, the embodiment of FIG. 4 includes a second actuator 7a. The actuator 7a is configured to actuate the cable bundle holder 6 in the y-direction. Furthermore, the sensor 8 is configured to measure the position of the cable bundle holder 6 with respect to the metro-frame 4 in both the x-direction and the y-direction. This sensor 8 may for instance be a combination of a capacitive sensor (for the x-direction) and an encoder type sensor (for the y-direction).

With this embodiment it is possible to avoid that next to vibrations/movements in the x-direction also vibrations/movements of the base frame 3 in the y-direction are transferred to the metro-frame 4. Thus, the position of the cable bundle holder 6 is controlled so that the cable bundle holder 6 remains substantially in the same position in the x-direction and y-direction with respect to the metro-frame 4. As a consequence, the cable bundle holder 6 will follow any movements of the metro-frame 4 in the x-direction and the y-direction.

In alternative embodiments, it is also possible to provide a control system including sensors actuators and a controller with which the position of the cable bundle holder 6 in three or more degrees of freedom can be controlled. With such embodiment the cable bundle holder can follow the metro-frame in a corresponding number of degrees of freedom.

It is beneficial that the control system be provided to control the position of the cable bundle holder 6 in that direction or those directions in which the stiffness of the cable bundle is the largest. In other directions, the stiffness of the cable bundle may be relatively low when compared to the stiffness of the air mounts 5 so that in that direction or directions the position of the cable bundle does not has to be controlled in order to avoid the transfer of vibrations via the cable connection.

Hereinabove, the active cable connection according to an embodiment of the invention has been described with respect to the cable connection running between the metro-frame and the baseframe of a lithographic apparatus. It will be appreciated for the man skilled in the art that the active cable connection may be used in any cable connection between a first object and a second object, in which it is desirable to reduce any influence of the first object to the second object.

In particular, the active cable connection in accordance with an embodiment of the invention may be used in a cable connection between a long stroke module and a short stroke module of a substrate stage or a patterning device stage, as it is undesired that vibrations from the long stroke module are passed on or transferred to the short stroke module via the cable connection, which may be the only mechanical connection between these two objects.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A cable connection between a first object and a second object, comprising:
    a cable bundle including one or more cables, one end of the cable bundle fixed to the first object and another end of the cable bundle fixed to the second object;
    a cable bundle holder configured to hold the cable bundle at a certain location along a length of the cable bundle, such that a shape of a portion of the cable bundle between the cable bundle holder and the second object does not substantially change; and
    a control system configured to control a position of the cable bundle holder with respect to the second object.

2. The cable connection of claim 1, wherein the control system is configured to control the position of the cable bundle holder such that the cable bundle holder remains at substantially a same position with respect to the second object in at least one degree of freedom.

3. The cable connection of claim 1, wherein the control system is configured to control the position of the cable bundle holder with respect to the second object in two or more degrees of freedom.

4. The cable connection of claim 1, wherein the cable bundle holder is configured to fixedly hold the cable bundle.

5. A cable connection between a first object and a second object, comprising:
    a cable bundle including one or more cables, one end of the cable bundle fixed to the first object and another end of the cable bundle fixed to the second object;
    a cable bundle holder configured to hold the cable bundle at a certain location along a length of the cable bundle; and
    a control system configured to control a position of the cable bundle holder with respect to the second object comprising:
        a sensor configured to measure a position quantity of the cable bundle holder with respect to the second object,
        an actuator configured to actuate the cable bundle holder, and
        a controller configured to provide a control signal to the actuator based on the position quantity measured by the sensor.

6. The cable connection of claim 5, wherein the controller comprises a feed-forward unit.

7. The cable connection of claim 5, wherein the controller comprises a feedback control unit.

8. The cable connection of claim 5, wherein the actuator is mounted on the first object.

9. The cable connection of claim 5, wherein the sensor is configured to measure the position quantity in a first degree of freedom, the actuator being configured to actuate the cable bundle holder in the first degree of freedom.

10. The cable connection of claim 9, wherein the sensor or a second sensor is configured to measure a position quantity of the cable bundle holder in a second degree of freedom, the actuator or a second actuator further being configured to actuate the cable bundle holder in the second degree of freedom.

* * * * *